United States Patent [19]

Fielden

[11] 4,345,311
[45] Aug. 17, 1982

[54] ELECTRONIC KILOWATT-HOUR METER FOR MEASURING ELECTRICAL ENERGY CONSUMPTION

[75] Inventor: John S. Fielden, Devon, England

[73] Assignee: South Eastern Electricity Board, Hove, England

[21] Appl. No.: 110,027

[22] Filed: Jan. 7, 1980

[30] Foreign Application Priority Data

Jan. 11, 1979 [GB] United Kingdom ............... 7901133

[51] Int. Cl.³ ..................... G01R 21/06; G06F 15/20
[52] U.S. Cl. ............................... 364/483; 364/464; 324/142
[58] Field of Search ............ 364/483, 464, 492, 493; 235/92 MT, 92 EL; 324/103 R, 137, 142, 79 R, 79 D; 331/21, 25

[56] References Cited

U.S. PATENT DOCUMENTS

| | | | |
|---|---|---|---|
| 3,448,402 | 6/1969 | Booker, Jr. et al. ................ | 331/21 |
| 3,959,724 | 5/1976 | Chana et al. ........................ | 364/483 |
| 4,073,009 | 2/1978 | Andow et al. ....................... | 364/483 |
| 4,106,095 | 8/1978 | Yarbrough .......................... | 364/464 |
| 4,120,031 | 10/1978 | Kincheloe et al. ................ | 364/464 |
| 4,197,582 | 4/1980 | Johnston et al. ................... | 364/483 |
| 4,216,527 | 8/1980 | Emerson et al. ................... | 364/483 |
| 4,218,737 | 8/1980 | Buscher et al. .................... | 364/483 |

Primary Examiner—Mark E. Nusbaum
Assistant Examiner—Gary Chin
Attorney, Agent, or Firm—Beveridge, Degrandi and Kline

[57] ABSTRACT

In a kilowatt-hour meter for measuring electrical energy consumption from an alternating electrical supply, a microprocessor includes a clock signal generator which is synchronized in phase with the incoming supply frequency. Pulse sampling means controlled by the clock generator sample the incoming voltage and current waveforms at a preselected time instant or instants in each cycle and the sampled data is utilized in the microprocessor to determine energy consumption.

7 Claims, 1 Drawing Figure

U.S. Patent     Aug. 17, 1982     4,345,311
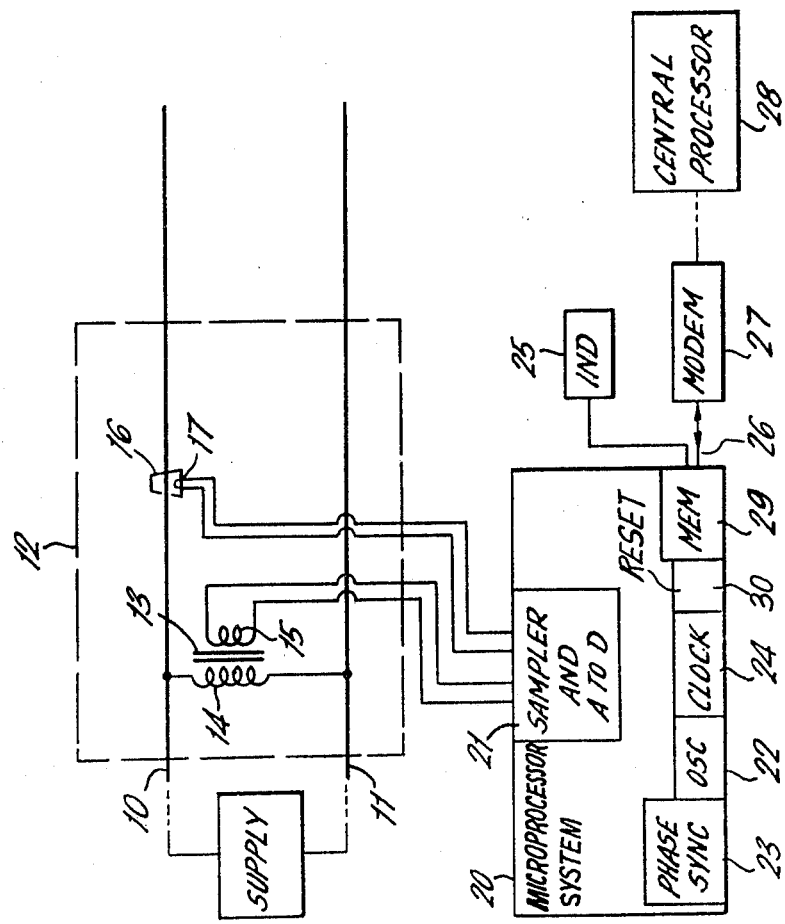

ELECTRONIC KILOWATT-HOUR METER FOR MEASURING ELECTRICAL ENERGY CONSUMPTION

BACKGROUND OF THE INVENTION

This invention relates to kilowatt-hour meters such as are provided on a consumer's premises to measure electrical energy consumption.

At the present time, kilowatt-hour meters are electromechanical devices which effect analogue multiplication of the instantaneous values of voltage and current and analogue integration of the product. It is one of the objects of the present invention to provide an improved form of kilowatt-hour meter in which the determination of energy consumption is effected electronically.

SUMMARY OF THE INVENTION

According to this invention, a kilowatt-hour meter for determining, from voltage and current signals, the total energy passing through an alternating electrical supply circuit comprises a clock signal generator for generating timing signals at a frequency which is a multiple of the alternating supply frequency, the timing signals being synchronised in phase with the incoming supply frequency, pulse sampling means controlled by said clock signal generator and arranged to sample simultaneously the magnitude of the voltage on and the current in said supply circuit at a predetermined time instant or instants in each cycle and digital data processing means arranged to process the sampled data to determine energy consumption during successive predetermined periods of time and to integrate the successive determinations of energy consumption.

Such an arrangement may be used with a three phase supply in which case the three phase voltages and phase currents are separately sampled or it may be used with a single phase supply in which case only a single voltage and current has to be sampled. The digital data processing means, which is typically a microprocessor system, effects the required computations from the sampled values.

If a single phase supply is considered with the circuit carrying a current I at a voltage V and with a phase lag (or phase lead) between the current and voltage of $\phi$, then if the waveforms were sinusoidal, the power consumption is VI cos $\phi$. Conveniently, this can be measured by pulse sampling during the peak of one of the waveforms. Preferably the measurement is made at the peak of the voltage waveform, so as to determine the instantaneous peak value of V and of I cos $\phi$. The r.m.s. product can be readily determined by processing of this information. It may be preferred to average successive determinations of V and of I cos $\phi$ separately over a number of cycles of the alternating supply frequency, typically a few hundred cycles, before determining the product and hence the energy consumption during this period.

In general however, the waveforms may not be sinusoidal and preferably therefore the sampling is effected a number of times, at predetermined time instants, in each cycle of the alternating supply. The supply may be regarded as having a major component at the fundamental frequency, e.g. 50 Hz or 60 Hz, together with lesser components at harmonic frequencies. It will be immediately apparent that sampling at the voltage peak of the fundamental frequency will not measure any power in the second harmonic (that is at double the fundamental frequency). The power in the second harmonic may be determined by measurements at appropriate sampling points. In existing types of electromechanical kilowatt-hour meters, mechanical inertia gives a smoothing effect so that the power consumption indication is arranged throughout the cycle. This effect can be achieved, in the kilowatt-hour meter of the present invention, by multiple sampling during each cycle. However, by the precise choice of sampling instants in the cycle it becomes possible by data-processing techniques selectively to control the inclusion of the power content of harmonics in the integrated output of the kilowatt-hour meter. The data handling capacity of present-day data processors, for example microprocessor systems, makes it readily possible for the data available from multiple sampling in each cycle to be processed for example to control the inclusion of the power content of harmonics in the integrated total.

Thus preferably the pulse sampling is effected repetitively at a plurality of preselected times in each cycle of the incoming voltage waveform. The kilowatt-hour meter may have a voltage transformer to provide an analogue voltage waveform to said pulse sampling means and a current transformer to provide an analogue current to said pulse sampling means and the analogue-to-digital conversion may be effected in said digital data processing means to convert the sampled voltage and current magnitudes separately into digital data for processing.

It is convenient, with the kilowatt-hour meter of the present invention, to transmit information from said digital data processing means via a data link to a central data processor at the supply utility. Such a data link need not be continuously available since the central processor need only periodically interrogate the customer's digital data processing means. Such a data link, using a time-sharing operation, may employ existing telephone lines or may use the power supply network, e.g. by a superimposed carrier or may be by radio communication or by optical fibres.

The output from the clock signal generator may be integrated, e.g. counted in a digital counter to provide clock time. If a data link is provided, the aforementioned clock signal generator may be utilized to provide clock timing for time-controlled operations, e.g. for example, the customer's data processing means may compute monetary charges; to ensure correct clock time, the integrated output from the clock signal generator may be periodically updated over the data link. It will be understood that such periodic updating is required to correct the clock in the event of any interruption of the supply. Such a clock may be used, for example, for effecting changes in the data processing related to absolute time; e.g. variation of charging rates in accordance with time.

In particular, the invention includes within its scope a kilowatt-hour meter as described above and having a two-way data communication link for transmission of data to and reception of data and other signals from a distant central data processor.

BRIEF DESCRIPTION OF THE DRAWING

The accompanying drawing is a block diagram illustrating one construction of kilowatt-hour meter forming one embodiment of the invention.

DESCRIPTION OF THE PREFERRED EMBODIMENT

In the drawing there is shown a single phase incoming alternating supply having a live lead 10 and a return lead 11 extending through a unit 12, forming part of a kilowatt-hour meter. This unit 12 contains a voltage transformer 13 having an input winding 14 connected between leads 10 and 11 and an output winding 15 giving a low voltage output, typically at about 12 volts, for measurement purposes and as a power supply for a microprocessor system to be described later. The unit 12 also contains a current transformer 16 providing, from a winding 17, an analogue output representative of the current drawn from the supply. The microprocessor system is in a unit 20, which may be physically remote from unit 12. The voltage and current signals are processed in the microprocessor system as short duration pulse samples, as will be further described later, and the microprocessor system includes analogue-to-digital conversion means 21 incorporating pulse sampling means to convert the voltage and current signals into digital data representative of the voltage between leads 10, 11 and the current through lead 10. The microprocessor system also contains an oscillator 22, constituting a timing signal generator, which is locked in phase with the alternating supply voltage by phase locking means 23, including a sampling means controlled by the microprocessor system to determine an error signal representative of the time difference between the sampling point and the zero crossing point, the error signal providing a feedback control for the oscillator. The phase locked oscillator produces timing signals at a frequency which is a multiple of and synchronised in phase with the incoming main supply voltage.

These timing signals control the timing of the sampling pulses and also control a clock 24 to provide time information to the microprocessor system. The sampling pulses are arranged to occur at a number of preselected time instants in each cycle, the magnitudes of the current and voltage being sampled at each instant. These magnitudes are converted to digital form in the analogue-to-digital converter 21 and this information is processed to give an energy consumption measurement every 375 cycles, that is approximately 7½ seconds. This energy consumption is summed to give an integrated output which is indicated on an indicator 25.

As an example of one form of sampling, it might be required, in a kilowatt-hour meter for domestic premises, to reject measurement of all harmonic power content up to the fourth harmonic. In this case, the eight samples per cycle may be employed, these samples being at time instants defined by the following phase angles with respect to the start of a zero-crossing point forming the start of the cycle: 45°, 75°, 105°, 135°, 225°, 255°, 285°, 315°. It will be readily apparent that, by using more samples, even higher harmonics can be rejected. Alternatively power can be measured to include harmonic content by appropriate choice of sampling points.

Information from the microprocessor system 20 is fed via a data link 26, including a modem or isolating interface 27, to a central processor 28 at the supply utility. Typically such data transmission would be only upon interrogation from the central processor 28 of a memory 29 in the microprocessor system 20 and thus only intermittent use of the data link is required. This data link may make use of a telephone system or may use the power transmission cables for data transmission, e.g. using a superimposed carrier frequency or may use a radio link or optical fibres. The data link is a two-way link and information is fed from the central processor, for example, to reset the clock periodically by reset device 30 so that it is corrected after any interruption of the power supply. Clock information is utilised in the microprocessor system, for example, to enable energy consumption measurements to be made corresponding to different periods of the day during which different tariffs for charging apply.

I claim:

1. A kilowatt-hour meter for determining, from voltage and current signals, the total energy passing through an alternating electrical supply circuit, said meter comprising a clock signal generator including a timing signal frequency generator for generating timing signals at a frequency which is a multiple of the alternating supply frequency and phase locking means for synchronising the phase of the timing signals with the phase of the alternating supply frequency, pulse sampling means controlled by the timing signals generated by said clock signal generator for sampling the magnitudes of the voltage on and current in the alternating electrical supply circuit at a preselected time in each cycle, and digital data processing means for processing the sampled data to determine energy consumption during successive predetermined periods of time and to integrate the successive determinations of energy consumption.

2. A kilowatt-hour meter as claimed in claim 1 wherein the digital data processing means comprises a solid state microprocessor.

3. A kilowatt-hour meter as claimed in claim 1 wherein said pulse sampling means samples the voltage and current waveforms repetitively at a plurality of preselected times in each cycle of the incoming voltage waveform.

4. A kilowatt-hour meter as claimed in claim 1 further comprising a voltage transformer for providing an analogue voltage waveform to said pulse sampling means and a current transformer for providing an analogue current waveform to said pulse sampling means; said digital data processing means including analogue-to-digital conversion means for converting the sampled voltage and current magnitudes separately into digital data for processing.

5. A kilowatt-hour meter as claimed in claim 1 further comprising a two-way data communication link to a distant central data processor for transmission of processed data from said digital data processing means to the central data processor and reception of data and other signals from the distant central data processor.

6. A kilowatt-hour meter as claimed in claim 5 wherein the clock signal generator further comprises reset means for periodically resetting the clock signal generator in accordance with the clock time from the distant central data processor.

7. A kilowatt-hour meter as claimed in claim 5 further comprising a modem for coupling said digital data processing means and said data communication link.

* * * * *